(12) United States Patent
Orcutt

(10) Patent No.: US 7,259,900 B2
(45) Date of Patent: Aug. 21, 2007

(54) MULTILAYER TORSIONAL HINGED MIRROR WITH A RECESSED DRIVE/SENSING PERMANENT MAGNET

(75) Inventor: John W. Orcutt, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 336 days.

(21) Appl. No.: 11/054,926

(22) Filed: Feb. 10, 2005

(65) Prior Publication Data

US 2005/0157363 A1 Jul. 21, 2005

Related U.S. Application Data

(63) Continuation-in-part of application No. 10/681,934, filed on Oct. 9, 2003, now Pat. No. 6,956,684, and a continuation-in-part of application No. 10/682,015, filed on Oct. 9, 2003, now Pat. No. 6,999,215.

(60) Provisional application No. 60/556,121, filed on Mar. 24, 2004, provisional application No. 60/424,915, filed on Nov. 8, 2002.

(51) Int. Cl.
*G02B 26/08* (2006.01)

(52) U.S. Cl. ........................................ 359/224; 359/199
(58) Field of Classification Search ..................... None
See application file for complete search history.

(56) References Cited

U.S. PATENT DOCUMENTS 7,050,211 B2 * 5/2006 Orcutt ......................... 359/224
2005/0225821 A1 * 10/2005 Orcutt ......................... 359/224

* cited by examiner

*Primary Examiner*—James Phan
(74) *Attorney, Agent, or Firm*—William B Kempier; W. James Brady, III; Frederick J. Telecky, Jr.

(57) ABSTRACT

A multilayered torsional hinged mirror assembly that includes a drive/sensing permanent magnet. To allow for permanent magnets having increased thicknesses, a hinge plate of the mirror defines a recess for receiving the permanent magnet. The recess may be etched completely through the hinge plate such that the permanent magnet is bonded to the back side of the mirror layer, or alternately may extend part way through the hinge plate to allow the permanent magnet to be mounted to the bottom of the recess. In both embodiments, the center of mass of the mirror assembly can be adjusted to lie on the pivoting axis of the mirror assembly by selection of the depth of the recess and the shape and mass of the permanent magnet.

20 Claims, 3 Drawing Sheets

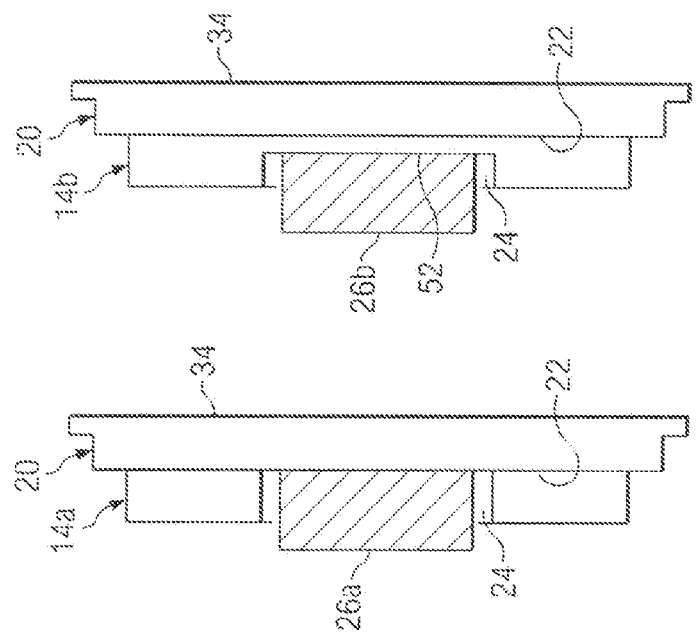
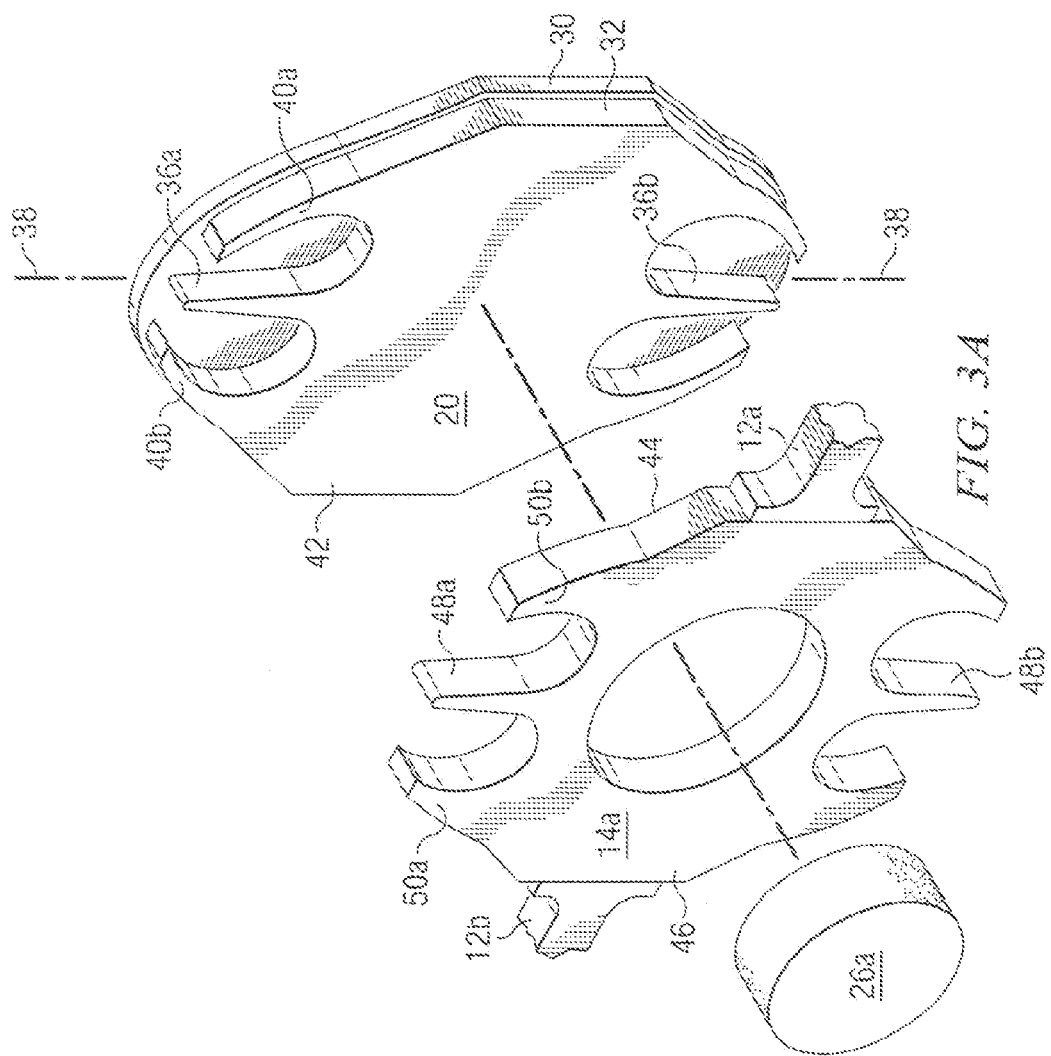

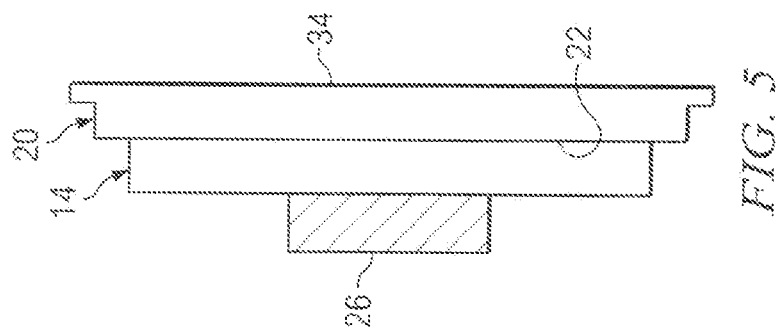
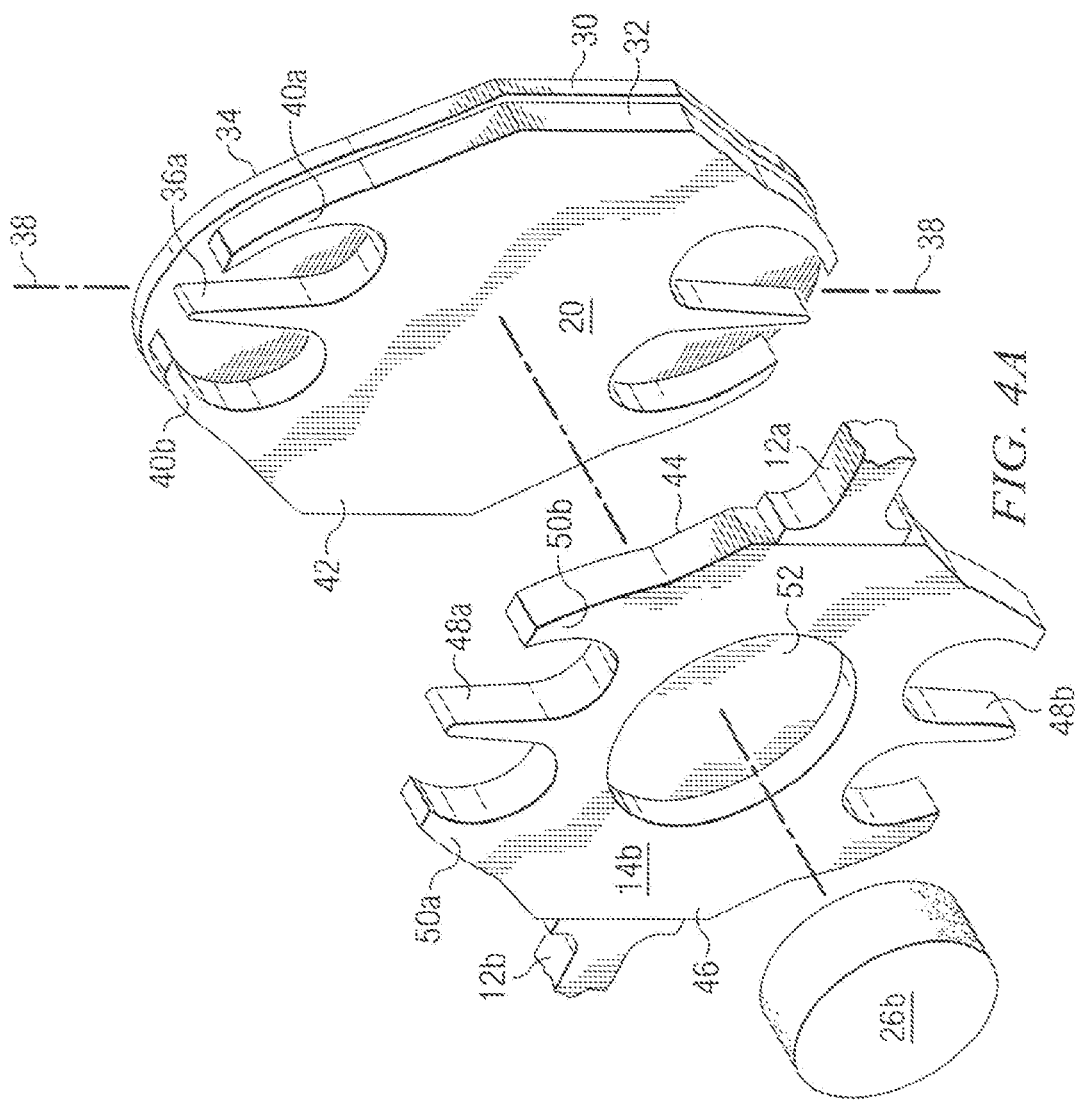

MULTILAYER TORSIONAL HINGED MIRROR WITH A RECESSED DRIVE/SENSING PERMANENT MAGNET

CROSS-REFERENCE TO RELATED APPLICATIONS

This application claims the benefit of U.S. Provisional Application No. 60/556,121, filed on Mar. 24,2004; and is a Continuation-In-Part of U.S. application Ser. No. 10/681, 934 filed on Oct. 9, 2003, now U.S. Pat. No. 6,956,684, which claims benefit to Provisional Application No. 60/424, 915, filed on Nov. 8, 2002; and is a Continuation-In-Part of U.S. application Ser. No. 10/682,015 filed on Oct. 9, 2003, now U.S. Pat. No. 6,999,215, which claims benefit to Provisional Application No. 60/424,915, filed on Nov. 8, 2002. Each of these applications is hereby incorporated herein by reference.

This application relates to the following co-pending and commonly assigned patent applications: Ser. No. 11/055, 392, filed concurrently herewith, entitled A Torsional Hinged Mirror Assembly With Central Spines And Perimeter Ridges To Reduce Flexing; and Ser. No. 11/066,834, filed Feb. 24, 2005, entitled A Single Piece Torsional Hinted Device With Central Spines And Perimeter Ridges To Reduce Flexing, which applications are hereby incorporated herein by reference.

TECHNICAL FIELD

The present invention relates to multlilayered torsional hinged mirror assemblies using a single centered permanent magnet for providing torque or alternately for sensing. More particularly, the invention relates to such a mirror assembly that is suitable for high speed operation and that avoids excessive stresses that cause deformation of the mirror.

BACKGROUND

Pivoting or oscillating torsional hinged mirrors provide a very effective, yet inexpensive replacement for spinning polygon shaped mirrors used in printers and some displays. As will be appreciated by those skilled in the art, many of the torsional hinged mirrors are MEMS type mirrors etched from a silicon substrate by processes similar to that used in the manufacturing of semiconductor devices. Early versions of the torsional hinged mirrors for providing a raster type scan for printing and displays required speeds of about 3 KHz. Multilayer mirrors that operate in this speed range or slower could be manufactured with a drive/sensing magnet that was readily mounted or bonded to the back side of the hinge plate or layer. Further, the size and shape of the permanent magnet could readily be selected such that the moment of inertia of the magnet balanced the moment of inertia of the mirror layer. Balancing the mirror layer and the permanent magnet on either side of the hinge plate or layer results in the mass center of the mirror assembly lying on the pivoting axis of the mirror. However, as the demand for higher and higher oscillating speeds has resulted in smaller and smaller mirror assemblies, the corresponding requirement of smaller permanent magnets has resulted in problems in manufacturing magnets sufficiently reduced in size.

More specifically, presently available manufactured disc shaped permanent magnets have a minimum diameter of about 0.50 mm and a length or depth of about 0.20 mm. Although, these dimensions are very small, the moment of inertia of a magnet the size is still greater than the moment of inertia of the mirror layer of the smaller high speed mirrors. Therefore, when these small magnets are mounted to the back side of the hinge plate or layer, they are still too large such that the center of the mass moment of the assembled mirror device does not lie on the pivoting axis. This unbalanced assembly is unacceptable.

Therefore, a method of fabricating a small high speed mirror assembly with the mass moment center of the assembly located on the pivoting axis of the assembly would be advantageous.

SUMMARY OF THE INVENTION

The present invention provides a multilayered mirror assembly and a method of manufacturing such a mirror assembly comprising a mirror layer having a front reflective surface with edges defining a selected perimeter shape. A hinge layer with a selected thickness and a mirror side and a back side is bonded to a back side of the mirror layer. The hinge layer further defines a pair of torsional hinges that lie along a pivoting axis and also includes a recess having a selected shape. The recess is defined in the back side of the hinge layer and extends a selected depth or distance into the hinge layer. A permanent magnet such as a disc shaped permanent magnet is mounted in the recess and according to a first embodiment is attached or bonded on a surface at the bottom of the recess of the hinge layer. More specifically, the selected depth of the recess in the hinge layer is less than the selected thickness of the hinge layer. Therefore, the bottom of the recess in the hinge layer defines a bottom surface. Thus, the permanent magnet may be located in the recess with the bottom surface of the magnet bonded to the bottom surface of the recess. Thus, by providing a recess for locating the permanent magnet in the hinge plate, the mass moment center of the entire assembly may be located on the pivoting axis by controlling the depth of the recess and the size of the permanent magnet. As an example, presently available permanent magnets having a size limit of 0.5 mm diameter and 0.2 mm in thickness have been used according to this embodiment.

According to another embodiment of the invention, the selected depth of the recess is the same as the selected thickness of the hinge layer. This of course means that the recess forms an aperture completely through the hinge layer. Therefore, according to this embodiment, the permanent magnet is also located in the recess, however, the bottom side of the permanent magnet is mounted or bonded to the back side of the mirror layer. This arrangement has the advantage in that manufacturing magnets of a sufficiently small size presents no serious difficulties. However, forces on the magnet introduce stresses on the mirror plate, which may affect flatness.

The above described embodiments for mirror assemblies may be used with various types of mirror assemblies, including multilayered mirror assemblies wherein the back side of the mirror layer defines a central spine and a pair of perimeter ridges for reducing the flexing of the mirror. Other embodiments of the mirror assembly may include a hinge plate that also includes central spines and/or perimeter ridges.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIGS. 3A and 3B show an exploded view and a simplified cross section of the mirror embodiment of FIG. 2 wherein the recess in the hinge plate extends completely through the hinge plate;

FIGS. 4A and 4B illustrate another embodiment of the present invention where the recess defined in the hinge plate extends less than completely through the hinge plate; and FIG. 5 is a simplified cross-sectional view of a larger and slower speed prior art mirror wherein the permanent mounted is mounted to the back side of the hinge plate.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
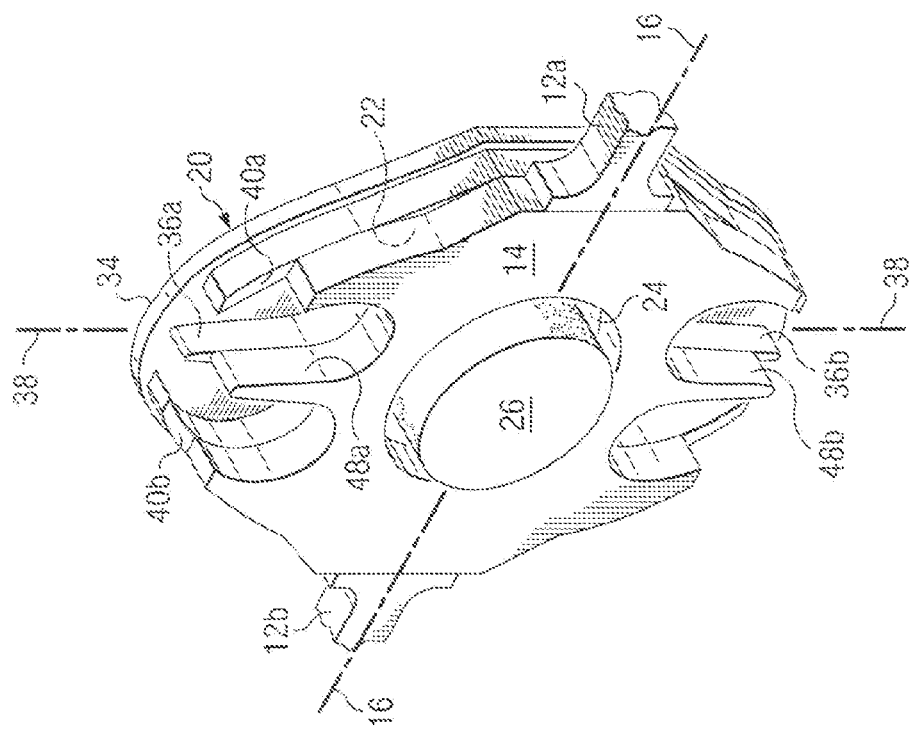
FIG. 1 is a perspective view of a complete mirror assembly incorporating the teachings of the present invention.

Referring now to FIG. 1, there is shown a perspective view of an embodiment of the present invention. As shown, the mirror assembly includes a pair of anchor plates 10a and 10b that support a pair of torsional hinges 12a and 12b. The torsional hinges in turn support a hinge plate 14 (14a). As will be appreciated by those skilled in the art, the mirror assembly may be designed to readily resonate at a selected frequency as it oscillates or pivots back and forth around its torsional hinges 12a and 12b, which lie along pivoting axis 16. The rotational motion is indicated by the circular double headed arrow 18. A mirror layer 20 is bonded along bonding surface 22 to a front face of the hinge plate 14. The hinge plate 14 defines a recess 24 that extends from the back surface of the hinge plate 14 into the hinge plate. A permanent magnet 26a (26b), which may be used as a drive magnet or alternately as a sensing magnet is located in the aperture 24. Preferably, the moment of inertia of the permanent magnet 26a (26b) is selected to balance the moment of inertia of the mirror layer 20 so that mass moment of the mirror assembly lies on the pivoting axis 16.

Figure 2:
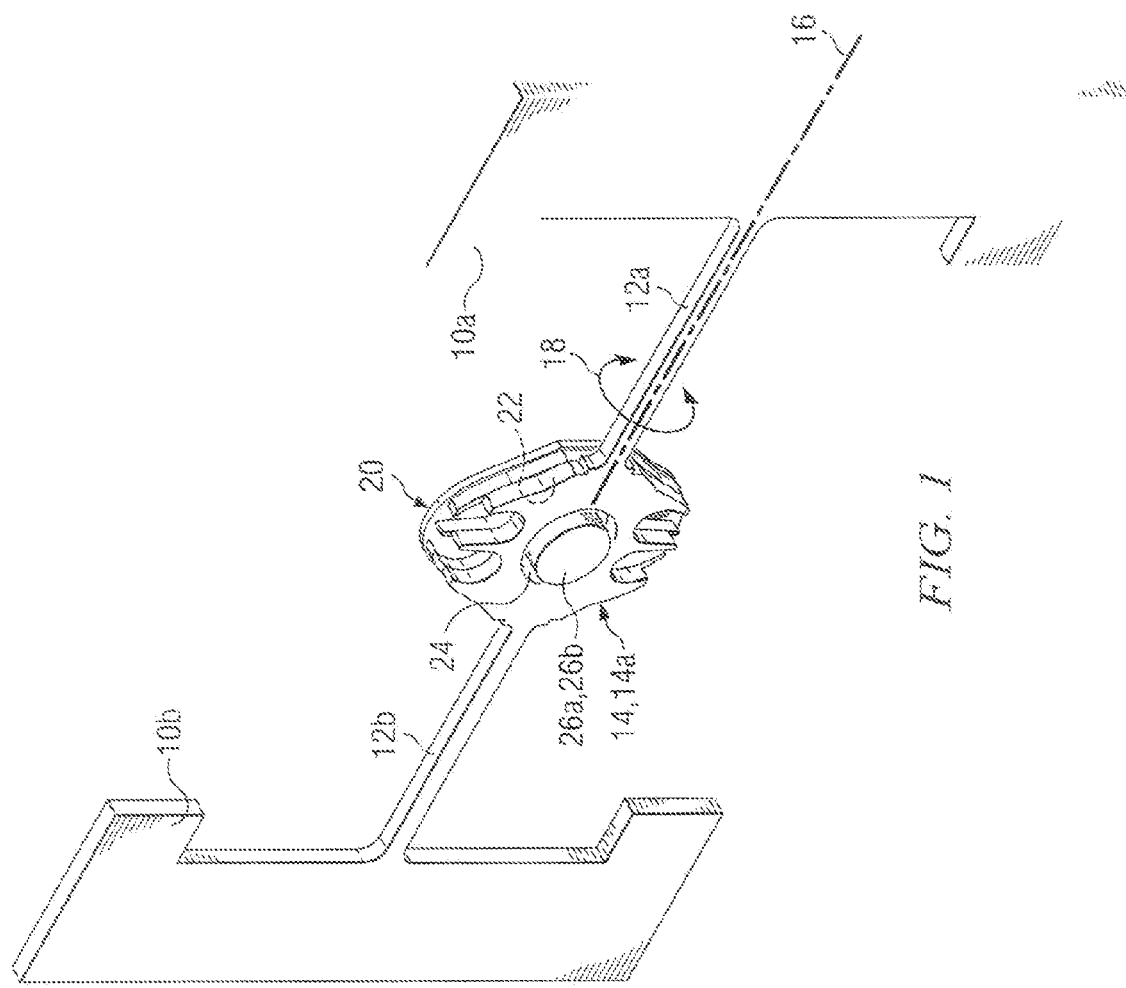
FIG. 2 is an enlarged view of a portion of the mirror assembly of this invention without anchor plates.

FIG. 2 is an enlarged view of FIG. 1, with only a short section of the torsional hinge and without the anchor plates.

Referring now to FIGS. 3A and 3B there is shown an exploded view and a cross-sectional view respectively of an embodiment of the present invention. Mirror elements shown in FIGS. 1 and 2 that are common with elements shown in FIGS. 3A and 3B carry the same reference numbers. Therefore, as shown, mirror layer 20 is shown according to one embodiment as having a front portion 30 and a back portion 32. The reflective surface 34 of the front portion 30 is hidden from view and cannot be seen. Further, it is noted that the front portion 30 in this embodiment may be thinner than the back portion 32. Further, as is clearly shown, the back portion 32 of the mirror layer 20 has been formed or etched so as to define spine members 36a and 36b that lie along a second axis 38. Also as shown, a pair of perimeter ridges 40a and 40b extend along the perimeter edge of the front portion 30. These perimeter ridges are also etched into the back portion 32. The back side of the mirror layer 20 is identified by reference number 42. It should also be appreciated that the front portion 30 and back portion 32, comprising mirror member 20, is preferably formed from a single or unitary piece of material, such as for example a silicon substrate. Also, as will be appreciated, the spines 36a and 36b and the perimeter ridges 40 may be etched into the silicon layer by processes commonly used in the manufacture of MEMS semiconductor products. Also as shown, there is a hinge plate 14a having a mirror side 44 and a back side 46. Further as was discussed above, the hinge plate 14 includes the torsional hinges 12a and 12b. As can be seen in FIGS. 3A and 3B, the aperture 24 formed in hinge plate 14a extends completely through the hinge plate in this embodiment. Thus, it will be appreciated that when the permanent magnet 26a is located in the aperture 24, it can be bonded to the back side 42 of the back portion 32 of the mirror layer 30. This design has advantages in that the permanent magnet 26a can be formed substantially thicker than in the prior art and still allow the mass moment of the complete mirror assembly to be located on the pivoting axis. Therefore designing a magnet with a proper size and mass presents no difficult issues with this embodiment. However, it will be appreciated by those skilled in the art that by bonding the permanent magnet 26a to the back side 42 of the mirror number 30, stresses created on the permanent magnet by a magnetic coil or other source may be transmitted to the mirror layer 20. Stress on the mirror layer may in turn stress and cause deformation of the reflective surface 34 of the mirror layer 20.

It will also be appreciated that the hinge plate 14a may also include center spines 48a and 48b as well as perimeter ridges such as perimeter ridges 50a and 50b that are aligned with the center spines and perimeter ridges on the mirror layer 20. These additional spines and ridges provide additional support so as to help prevent flexing of the mirror layer.

Referring now to FIGS. 4A and 4B there is shown another embodiment of the mirror assembly of the present invention. The embodiment of FIGS. 4A and 4B is similar to that discussed with respect to FIGS. 3A and 3B, and uses common reference numbers for common elements. However, as shown, the recess 24 is etched only part way through the hinge plate 14b such that a thin layer of material remains on the mirror side 44 of hinge plate 14b. Therefore, when the hinge plate 14b is bonded to the mirror layer 20, there is a substantially larger bonding area between the two elements. Also, as will be appreciated, when the permanent magnet 26b is located in the aperture 24 it can be bonded to the surface 52 at the bottom of the recess 24 rather than directly to the back side 42 of the mirror layer 20. Therefore, the stresses created on the permanent magnet 26b are transmitted to the hinge plate 14b rather than being applied directly to the mirror layer 20. This arrangement helps prevent stresses and deformation of the mirror layer 20. Unfortunately, as will be appreciated, the available size selection of the permanent magnet 26b will be substantially reduced from that available for use with the embodiment of FIG. 3A. For example, the minimum size of manufactured permanent magnets presently available have a diameter of 0.50 mm and a thickness or width of 0.2 mm. This size magnet has been successfully used in a properly balanced mirror assembly having length dimensions of about 1.5 mm and a width of about 1.0 mm. However, if larger magnets are used with this size mirror assembly, the mass moment may be offset from the pivoting axis.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the mirror assembly described in the specification. As one of ordinary skill in the art will readily appreciate from the disclosure of the present invention, mrror assembly, presently existing or later to be developed, that perform substantially the same function or achieve substantially the same result as the corresponding embodiments described herein may be utilized according to the present invention. Accordingly, the appended claims are intended to include within their scope such mirror assembly.

What is claimed is:

1. A multilayered mirror assembly comprising:
   a mirror layer having a front reflective surface with edges defining a selected outer shape and a backside;
   a hinge layer having a mirror side and a back side, and a selected thickness, said mirror side of said hinge layer bonded to said back side of said mirror layer and said hinge layer defining a pair of torsional hinges that lie along a pivoting axis;
   a recess having a selected shape defined in said back side of said hinge layer and extending a selected depth into said hinge layer;
   a permanent magnet having a shape and size selected for mounting said permanent magnet in said recess, said permanent magnet having a bonding side attached to one of said hinge layer and said mirror layer.

2. The mulitlayered mirror assembly of claim 1 wherein said selected depth of said recess is less than said selected thickness of said hinge layer such that said hinge layer defines a bottom surface of said recess and wherein said bonding side of said permanent magnet is attached to said bottom surface.

3. The mulitlayered mirror assembly of claim 2 wherein said permanent magnet has a selected size and mass and wherein the depth of said recess is selected so that the mass moment center of said multilayered mirror assembly lies substantially on said pivoting axis.

4. The mulitlayered mirror assembly of claim 1 wherein said selected depth of said recess is the same as said selected thickness, such that said recess defines an aperture completely through said hinge layer and wherein said bonding side of said permanent magnet is attached to the back side of said mirror layer.

5. The mulitlayered mirror assembly of claim 4 wherein the mass and size of said permanent magnet is selected so that the mass moment of said multilayered mirror assembly lies substantially on said pivoting axis.

6. The mulitlayered mirror assembly of claim 1 wherein said mirror layer defines first and second spines extending perpendicular to said pivoting axis.

7. The multilayered mirror assembly of claim 6 wherein said mirror layer further defines perimeter ridges that extend along said edges.

8. The mulitlayered mirror assembly of claim 6 wherein said hinge layer further defines first and second spines extending perpendicular to said pivoting axis and said first and second spines of said hinge layer being aligned with said first and second spines of said mirror layer.

9. The mulitlayered mirror assembly of claim 8 wherein said mirror layer further defines perimeter ridges that extend along said edges.

10. The mulitlayered mirror assembly of claim 9 wherein said hinge layer further defines perimeter ridges that align with said perimeter ridges of said mirror layer.

11. A method of fabricating a multilayered mirror assembly comprising the steps of:
    providing a mirror layer having a first reflective surface with edges defining a selected perimeter shape and a back side;
    bonding a hinge layer to said mirror layer, said hinge layer having a mirror side and a back side and a selected thickness, said mirror side of said hinge layer bonded to said back side of said mirror layer and said hinge layer defining a pair of torsional hinges that lie along a pivoting axis;
    forming a recess having a selected shape in said back side of said hinge layer, said recess extending a selected depth into said hinge layer;
    locating a permanent magnet in said recess and attaching said permanent magnet to one of said hinge layers and said mirror layer.

12. The method of claim 11 wherein said step of forming a recess comprises the step of forming said recess to a selected depth that is less than said selected thickness of said hinge layer so as to define a bottom surface of said recess and wherein said permanent magnet is attached to said bottom surface.

13. The method of claim 12 wherein the mass of said permanent magnet is selected and the depth of said recess is selected so that the mass moment center of said multilayer mirror assembly lies substantially on said pivoting axis.

14. The method of claim 11 wherein said step of forming said recess comprises the step of forming said recess completely through said hinge layer and wherein said permanent magnet is attached to said back side of said mirror layer.

15. The method of claim 14 wherein the mass and size of said permanent magnet is selected so that the mass moment center of said multi mirror assembly lies substantially on said pivoting axis.

16. The method of claim 11 further comprising the step of forming first and second spines in said mirror layer.

17. The method of claim 16 further comprising the step of forming perimeter ridges in said mirror layer that extend along the edges of said mirror layer.

18. The method of claim 16 further comprising the step of forming first and second spines in said hinge layer that align with said first and second spines of said mirror layer.

19. The method of claim 18 further comprising the step of forming perimeter ridges in said hinge layer that extend along the edges of said mirror layer.

20. The method of claim 19 further comprising the step of forming perimeter ridges in said hinge layer that align with said perimeter ridges formed in said mirror layer.

* * * * *